United States Patent
Lim et al.

(10) Patent No.: US 9,502,413 B2
(45) Date of Patent: Nov. 22, 2016

(54) SEMICONDUCTOR DEVICES INCLUDING RAISED SOURCE/DRAIN STRESSORS AND METHODS OF MANUFACTURING THE SAME

(71) Applicant: Samsung Electronics Co., Ltd., Suwon-si, Gyeonggi-do (KR)

(72) Inventors: Se-Chan Lim, Boryeong-si (KR); Sang-Pil Sim, Seongnam-si (KR); Dong-Kyun Sohn, Seongnam-si (KR); Su-Youn Yi, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/828,108

(22) Filed: Aug. 17, 2015

(65) Prior Publication Data

US 2015/0357329 A1    Dec. 10, 2015

Related U.S. Application Data

(62) Division of application No. 13/909,404, filed on Jun. 4, 2013, now abandoned.

(51) Int. Cl.
*H01L 21/8238* (2006.01)
*H01L 27/092* (2006.01)
*H01L 29/66* (2006.01)
*H01L 29/78* (2006.01)

(52) U.S. Cl.
CPC ..... *H01L 27/092* (2013.01); *H01L 21/823807* (2013.01); *H01L 21/823814* (2013.01); *H01L 21/823864* (2013.01); *H01L 29/66477* (2013.01); *H01L 29/66628* (2013.01); *H01L 29/66636* (2013.01); *H01L 29/78* (2013.01); *H01L 29/7848* (2013.01); *H01L 29/6656* (2013.01); *H01L 29/66545* (2013.01)

(58) Field of Classification Search
CPC ............. H01L 21/823814; H01L 21/823684; H01L 27/0922; H01L 29/6656
See application file for complete search history.

(56) References Cited

U.S. PATENT DOCUMENTS

| | | | |
|---|---|---|---|
| 6,214,679 B1 | 4/2001 | Murthy et al. | ................ 438/299 |
| 7,687,338 B2 | 3/2010 | Jain et al. | |
| 7,935,593 B2 | 5/2011 | Yang et al. | |
| 2006/0267117 A1 | 11/2006 | Jaiswal | |
| 2007/0075356 A1 | 4/2007 | Huang et al. | |
| 2007/0238250 A1 | 10/2007 | Zhang et al. | |
| 2008/0119019 A1 | 5/2008 | Han et al. | |

(Continued)

FOREIGN PATENT DOCUMENTS

KR    1020080044750    5/2008

*Primary Examiner* — Kevin Parendo
(74) *Attorney, Agent, or Firm* — Myers Bigel, P.A.

(57) ABSTRACT

A semiconductor device including source drain stressors is provided. The semiconductor device includes a gate structure including a gate insulating layer and a gate electrode on a semiconductor substrate. Gate spacers may be disposed on sidewalls of the gate structure and a stressor pattern including an impurity region is disposed on a side of the gate structure. The stressor pattern includes a protruded portion having a top surface higher than a bottom surface of the gate structure and a facet in the protruded portion. The facet is slanted at a predetermined angle with respect to an upper surface of the semiconductor substrate and forms a concave portion with one of the gate spacers. A blocking insulating layer may extend conformally on the stressor pattern and the gate spacers and an insulating wing pattern is disposed in the concave portion on the blocking insulating layer.

9 Claims, 12 Drawing Sheets

(56) References Cited

U.S. PATENT DOCUMENTS

| | | |
|---|---|---|
| 2008/0128748 A1 | 6/2008 | Iinuma .................. 257/190 |
| 2008/0145986 A1 | 6/2008 | Chidambarrao et al. |
| 2009/0095992 A1 | 4/2009 | Sanuki et al. ............ 257/288 |
| 2009/0170270 A1 | 7/2009 | Chakravarthi et al. |
| 2011/0312145 A1 | 12/2011 | Tsai et al. .............. 438/300 |
| 2012/0241868 A1 | 9/2012 | Tsai et al. .............. 257/369 |
| 2013/0049126 A1 | 2/2013 | Flachowsky et al. ...... 257/369 |
| 2013/0126949 A1 | 5/2013 | Liao et al. .............. 257/288 |

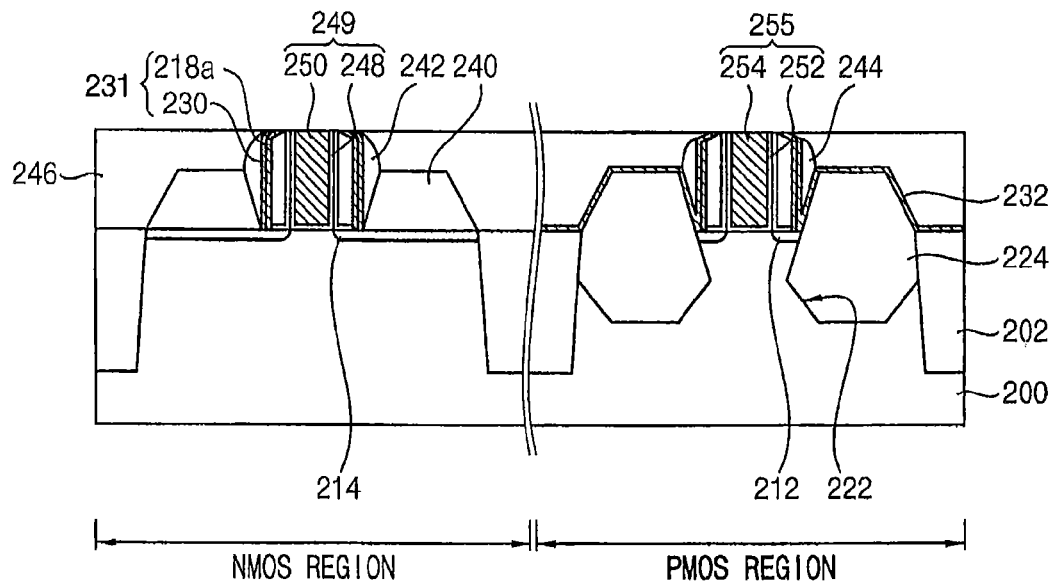
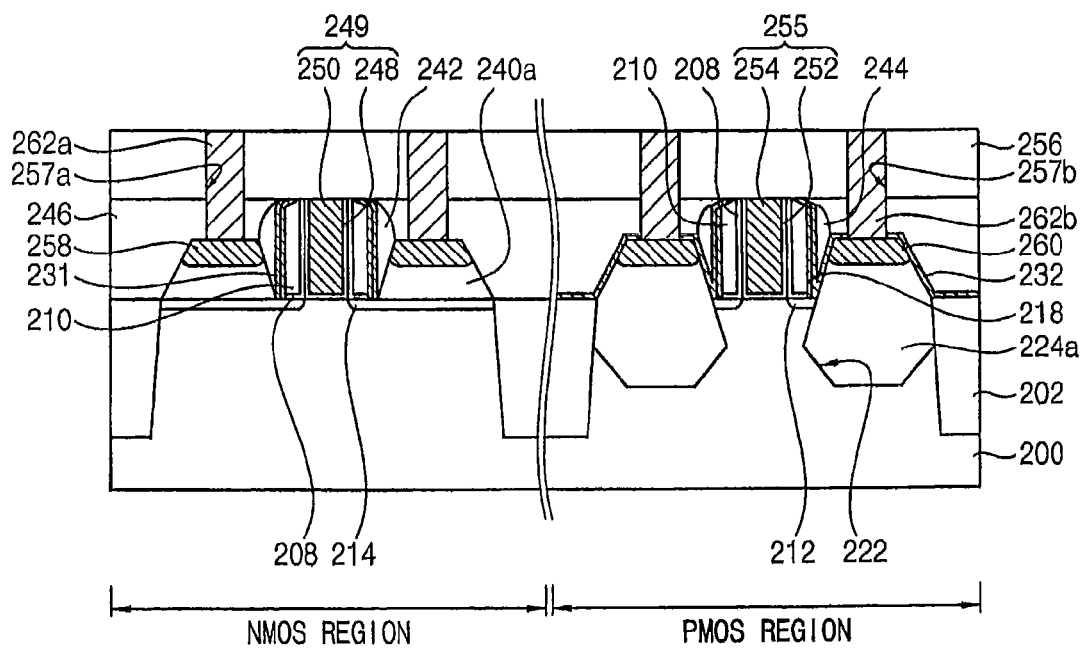

SEMICONDUCTOR DEVICES INCLUDING RAISED SOURCE/DRAIN STRESSORS AND METHODS OF MANUFACTURING THE SAME

CROSS-REFERENCE TO RELATED APPLICATION

This application is a divisional of U.S. patent application Ser. No. 13/909,404, filed Jun. 4, 2013, which claims priority under 35 U.S.C. §119 to Korean Patent Application No. 10-2012-0059923, filed on Jun. 4, 2012, in the Korean Intellectual Property Office (KIPO), the disclosures of which are hereby incorporated by reference herein its entirety.

FIELD

The present disclosure generally relates to the field of electronics, and more particularly semiconductor devices.

BACKGROUND

Source drain stressors may be used to increase the carrier mobility in the channel region of the MOS transistor. Tensile stressors may be used for an NMOS transistor and compressive stressors may be used for a PMOS transistor, for example, by providing raised source/drain as the stressors.

SUMMARY

A semiconductor device may include a gate structure including a gate insulating layer and a gate electrode on a semiconductor substrate. The semiconductor device may further include gate spacers on sidewalls of the gate structure. The semiconductor device may also include a silicon germanium pattern including an impurity region on a side of the gate structure. The silicon germanium pattern may include a protruded portion having a top surface higher than a bottom surface of the gate structure and a facet in the protruded portion. The facet may be slanted at a predetermined angle with respect to an upper surface of the semiconductor substrate and form a concave portion with one of the gate spacers. Additionally, the semiconductor device may include a blocking insulating layer extending conformally on the silicon germanium pattern and the gate spacers and an insulating wing pattern in the concave portion on the blocking insulating layer.

In various embodiments, the insulating wing pattern may include an insulating material having an etching rate different from that of the blocking insulating layer under a predetermined etching condition.

According to various embodiments, the blocking insulating layer may have a thickness in range of 10 Å to 30 Å.

In various embodiments, a portion of the silicon germanium pattern may be disposed in a recess portion in the semiconductor substrate.

According to various embodiments, the insulating wing pattern may cover a portion of the blocking insulating layer in the concave portion and may expose blocking insulating layer outside of the concave portion.

A semiconductor device may include a semiconductor substrate including an NMOSFET region and a PMOSFET region, a first gate structure and first spacers on sidewalls of the first gate structure in the NMOSFET region and a second gate structure and second spacers on sidewalls of the second gate structure in the PMOSFET region. The semiconductor device may further include a silicon pattern on a side of the first gate structure in the NMOSFET region. The silicon pattern may include a first protruded portion having a top surface higher than a bottom surface of the first gate structure and a first facet in the first protruded portion. The first facet may be slanted at a first predetermined angle with respect to an upper surface of the semiconductor substrate and form a first concave portion with one of the first spacers. The semiconductor device may also include a silicon germanium pattern on a side of the second gate structure in the PMOSFET region. The silicon germanium pattern may include a second protruded portion having a top surface higher than a bottom surface of the second gate structure and a second facet in the second protruded portion. The second facet may be slanted at a second predetermined angle with respect to the upper surface of the semiconductor substrate and form a second concave portion with one of the second spacers. Moreover, the semiconductor device may include a blocking insulating layer extending conformally on the silicon germanium pattern and the second spacers, a first insulating wing pattern in the first concave portion and a second insulating wing pattern in the second concave portion.

In various embodiments, the first and second insulating wing patterns may include an insulating material having an etching rate different from that of the blocking insulating layer under a predetermined etching condition.

According to various embodiments, the silicon pattern may include an N type impurity region and the silicon germanium pattern may include a P type impurity region.

In various embodiments, the semiconductor device may additionally include a first metallic silicide pattern on the silicon pattern and a second metallic silicide pattern on the silicon germanium pattern, and the first and second metallic silicide patterns may contact the silicon pattern and the silicon germanium pattern respectively.

According to various embodiments, the first and second metallic silicide patterns may include bottom surfaces higher than the bottom surfaces of the first and second gate structures respectively.

In various embodiments, the first gate structure may include a first gate electrode and the second gate structure may include a second gate electrode, and the first and second electrodes may include a metal.

According to various embodiments, the first and the second insulating wing patterns may include an identical material.

In various embodiments, the first insulating wing pattern may directly contact the one of the first spacers and the first facet of the silicon pattern, and a portion of the blocking insulating layer in the second concave portion may extend between the second insulating wing pattern and the one of the second spacers and between the second insulating wing pattern and the second facet of the silicon germanium pattern.

According to various embodiments, the blocking insulating layer may include silicon nitride and the first and second insulating wing patterns may include silicon oxide.

In various embodiments, the blocking insulating layer may have a thickness in range of 10 Å to 30 Å.

A method of fabricating an integrated circuit device may include forming a gate structure comprising a gate insulating layer and a gate electrode on a substrate and forming a gate spacer on a sidewall of the gate structure. The method may further include forming a stressor pattern on a side of the gate structure. The stressor pattern may include a raised portion extending above an upper surface of the substrate and a sidewall of the raised portion of the stressor pattern and a sidewall of the gate spacer may form an opening. The method may also include forming a blocking insulating layer on the stressor pattern, the gate spacer and the gate structure and forming an insulating wing pattern in the opening on the blocking insulating layer. A portion of the blocking insulating layer in the opening may extend between the insulating wing pattern and the stressor pattern and between the insulating wing pattern and the gate spacer.

In various embodiments, the insulating wing pattern may expose a portion of the blocking insulating layer formed on an upper surface of the stressor pattern, and the method may further include implanting dopants into the stressor pattern through the blocking insulating layer formed on the upper surface of the stressor pattern while the insulating wing pattern being exposed.

According to various embodiments, forming the blocking insulating layer may include forming the blocking insulating layer having a thickness in range of 10 Å to 30 Å.

In various embodiments, forming the insulating wing pattern may include forming the insulating wing pattern including an insulating material, which has etch selectivity relative to the blocking insulating layer.

According to various embodiments, additionally the method may include forming an insulating interlayer covering the insulating wing pattern and the stressor pattern and forming a contact pattern through the insulating interlayer and the blocking insulating layer formed on an upper surface of the stressor pattern. The contact pattern contacts the stressor pattern and a lower portion of the contact pattern may be surrounded by the blocking insulating layer.

BRIEF DESCRIPTION OF THE DRAWINGS

FIGS. 6A to 6J are cross-sectional views illustrating a method of fabricating the CMOSFET of FIG. 5.

DETAILED DESCRIPTION

Figure 1:
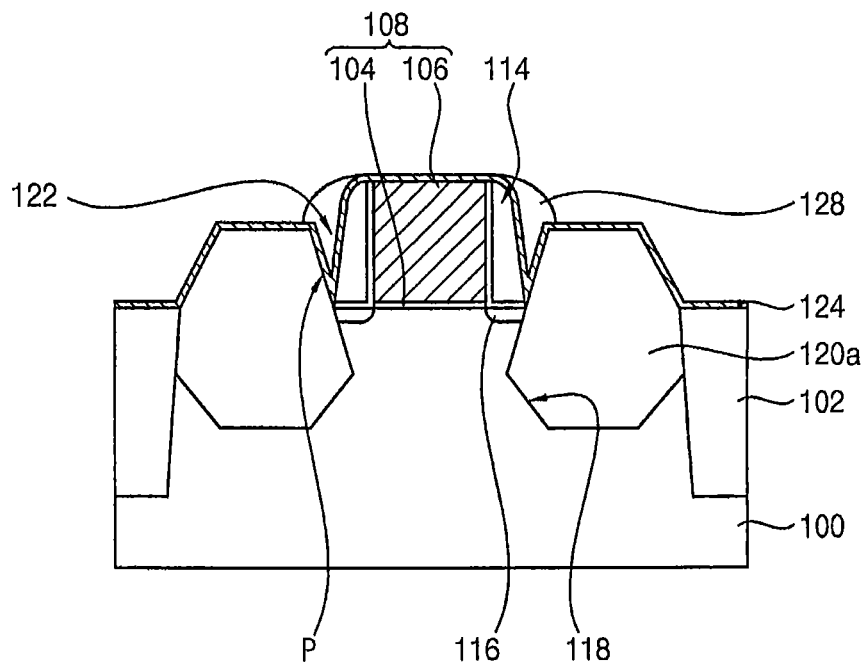
FIG. 1 is a cross-sectional view illustrating a PMOSFET according to some embodiments.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the inventive concepts are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, example embodiments of the inventive concepts should not be construed as limited to the particular shapes illustrated herein but include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, integers, steps, operations, elements, and/or components, but do not preclude the presence or addition of one or more other features, integers, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

FIG. 1 is a cross-sectional view illustrating a PMOSFET according to some embodiments.

Referring to FIG. 1, the PMOSFET is formed on a silicon substrate 100 and includes a gate structure 108, a gate spacer 114, a silicon germanium pattern 120a including an impurity region, a blocking insulating layer 124, and an insulating wing pattern 128.

The silicon substrate 100 may include a single crystalline silicon substrate or silicon on isolation (SOI) substrate. The silicon substrate 100 may be divided into an active region and a field region. The silicon substrate 100 may be provided at the field region thereof with an isolation layer pattern 102 formed through a Shallow Trench Isolation (STI) process. The silicon substrate 100 is provided at the active region thereof with a channel region.

The silicon substrate 100 includes a recess portion 118 provided at the outer portion of the channel region. A stressor 120a is provided in the recess portion 118. The recess portion 118 may have various shapes. However, the stress applied to the channel region may be adjusted according to the shape of the sidewall of the recess portion 118.

The recess portion 118 may include a sigma recess having a pointed portion at the sidewall thereof and having a width narrowed downwardly. The recess portion 118 may include a box type recess having a predetermined slope at the sidewall thereof.

The gate structure 108 is provided in opposition to the channel region of the silicon substrate 100. The gate structure 108 may have a structure in which a gate insulating layer 104 and a gate electrode 106 are stacked. The gate insulating layer 104 may include a silicon oxide layer or a metallic oxide layer having a high dielectric constant. The gate electrode 106 may include polysilicon or a metallic material.

The gate spacer 114 is provided on the sidewalls of the gate structure 108. The gate spacer 114 may include one insulating layer. According to some embodiments, as illustrated in FIG. 1, the gate spacer 114 may have the stacked structure of at least two insulating layers. For example, the gate spacer 114 may be formed by horizontally stacking silicon oxide (Si2O4) and silicon nitride (Si3N4). The gate structure 108 is spaced apart from the silicon germanium pattern 120a by providing the gate spacer 114.

The silicon germanium pattern 120a fills up the recess portion 118 of the silicon substrate 100 while protruding beyond the bottom surface of the gate structure 108. The silicon germanium patterns 120a are provided on the silicon substrate 100 at both sides of gate spacers 114.

The silicon germanium pattern 120a may be epitaxially grown and serves as a stressor to apply compressive stress to the channel region. Since silicon germanium (SiGe) has a lattice constant greater than that of silicon (Si), the silicon germanium causes compressive stress horizontally applied to an adjacent silicon substrate 100. Accordingly, the symmetric structure of a silicon crystal of the channel region is partially deformed, thereby increasing the mobility of holes.

The inner portion of the silicon germanium pattern 120a may be doped with P type impurities so as to make the silicon germanium pattern 120a serve as a P type impurity region. In other words, the silicon germanium pattern 120a may serve as a source/drain of a PMOS transistor.

Where the silicon germanium pattern 120a protrudes beyond the bottom surface of the gate structure 108, the top surface of the impurity region is disposed higher than the main surface of the silicon substrate 100. The main surface of the silicon substrate 100 may be a flat surface of the silicon substrate 100 having the channel region therein. As described above, a channel length can be increased by elevating the impurity region.

The top surface of the silicon germanium pattern 120a higher than ⅓ of the whole height of the gate structure 108 is desirable because the top surface of the silicon germanium pattern 120a lower than ⅓ of the whole height of the gate structure 108 may not affect the channel length.

The portion of the silicon germanium pattern 120a protruding beyond the bottom surface of the gate structure 108 includes a facet portion P having a predetermined angle with respect to the flat top surface of the silicon substrate 100. A valley 122 is formed between the facet portion P of the silicon germanium pattern 120a and the gate spacer 114, and a contact point between the facet portion P of the silicon germanium pattern 120a and the gate spacer 114 may be aligned in line with the surface of the silicon substrate 100.

Source/drain extension regions 116 may be provided between sides of the silicon germanium patterns 120a and at both end portions of the gate structure 108. The source/drain extension regions 116 have impurity concentration less than that of the P type impurity region.

The concentration of germanium (Ge) constituting the silicon germanium pattern 120a may be varied depending on the positions of the silicon germanium pattern 120a. As the germanium concentration is increased in the silicon germanium pattern 120a, crystal defects are increased, heat resistance is reduced, and degradation is significantly represented during the process. Therefore, the germanium concentration may be relatively lower at the upper portion of the silicon germanium pattern 120a because the upper portion of the silicon germanium pattern 120a is more greatly affected by the subsequent processes as compared with other portions.

In other words, the germanium concentration of the silicon germanium pattern 120a provided at the recess portion 118 may be greater than that of the silicon germanium pattern 120a protruding higher than the main surface of the silicon substrate 100. The silicon germanium pattern 120a may include a plurality of silicon germanium (SiGe) layers having different germanium concentrations.

The blocking insulating layer 124 is provided along the surficial profile of at least a portion of the silicon germanium pattern 120a and the gate spacer 114.

The blocking insulating layer 124 has a thickness to the valley 122 maintain the concave shape between the silicon germanium pattern 120a and the gate spacer 114. The blocking insulating layer 124 is thin enough not to completely fill the valley 122.

The blocking insulating layer 124 may have a thickness in range of 10 Å to 30 Å. The blocking insulating layer 124 having a thickness greater than 30 Å may affect a process of doping impurities into the silicon germanium pattern 120a. As appreciated by the present inventors, if the blocking insulating layer 124 has a thickness less than 10 Å, it may not be able to serve as an sufficient etch stop layer. The blocking insulating layer 124 may include silicon nitride (Si3N4), for example.

The insulating wing pattern 128 may be formed on a portion of the top surface of the blocking insulating layer 124. The insulating wing pattern 128 fills up the valley 122 between the silicon germanium pattern 120a and the gate spacer 114.

The insulating wing pattern 128 may include a material having etching selectivity with respect to the blocking insulating layer 124. That, the insulating wing pattern 128 may include an material having an etching rate different from the blocking insulating layer 124 with respect to a predetermined etching condition. For example, the blocking insulating layer 124 includes silicon nitride and the insulating wing pattern 128 may include silicon oxide (Si2O4).

The insulating wing pattern 128 makes direct contact with the portion of the top surface of the blocking insulating layer 124. The portion of the blocking insulating layer 124 may provide on the gate spacer 114 and the facet portion P of the silicon germanium pattern 120a adjacent to the gate spacer 114. In addition, the insulating wing pattern 128 is not provided at remaining portions other than the valley 122 between the silicon germanium pattern 120a and the gate spacer 114. Therefore, the insulating wing pattern 128 may be distinguished from an insulating interlayer covering the entire portion of a lower structure.

The blocking insulating layer 124 is provided at both sides of the insulating wing pattern 128. The blocking insulating layer 124 covers the silicon germanium pattern 120a not to be exposed while the insulating wing pattern 128 is formed. Therefore, the silicon germanium pattern 120a is prevented from being lowered due to the damage or the removal of the silicon germanium pattern 120a. The blocking insulating layer 124 protects the underlying the silicon germanium pattern 120a while the insulating wing pattern 128 is formed.

The PMOSFET includes a silicon germanium pattern which serves as stressor and stress applied to the channel region improve the mobility of holes. Therefore the PMOSFET according to some embodiments can provide high performance.

FIGS. 2A to 2E are cross-sectional views illustrating a method of fabricating the PMOSFET of FIG. 1.

Figure 2A:
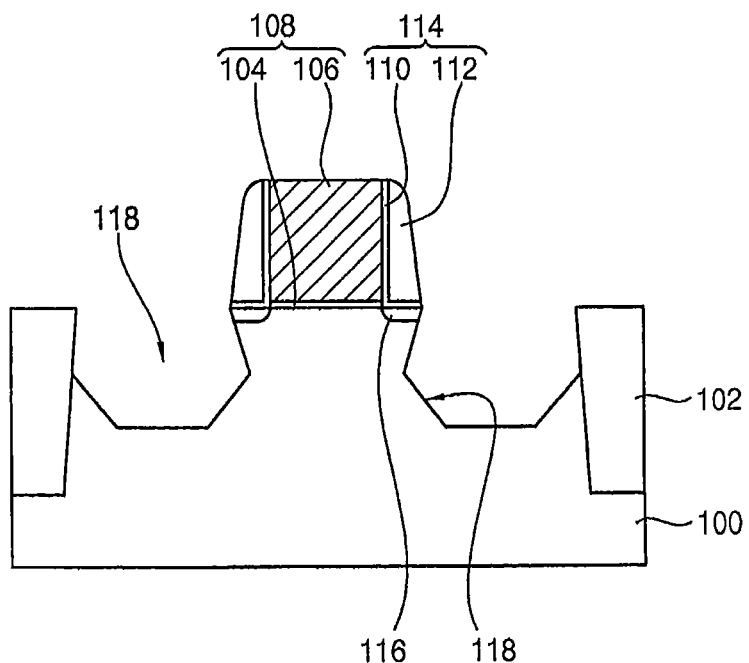
FIGS. 2A to 2E are cross-sectional views illustrating a method of fabricating the PMOSFET of FIG. 1.
Figure 2B:
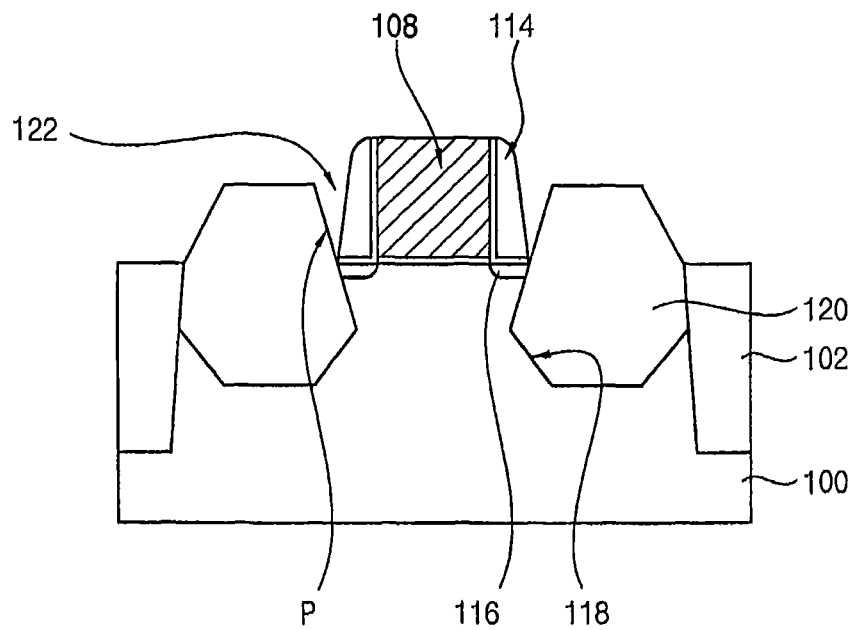

Referring to FIG. 2A, isolation layer patterns 102 are formed on the silicon substrate 100 corresponding to the field region by performing a device isolation process with respect to the upper portion of the silicon substrate 100. The device isolation process may include the STI process.

The gate structure 108 having the gate insulating layer 104 and the gate electrode 106 stacked therein is formed by sequentially forming a gate insulating layer and a gate electrode layer on the silicon substrate 100 and patterning the layers. A hard mask pattern may be formed on the top surface of the gate electrode 106 to pattern the layers.

A first spacer layer 110 is formed along the surfaces of the gate structure 108 and the silicon substrate 100. The first spacer layer 110 may serve as a spacer used to form a source/drain extension region 116. The P type impurities are doped under the surface of the silicon substrate 100 having the first spacer layer 110, thereby forming the source/drain extension region 116.

Subsequently, a second spacer layer 112 is formed on the first spacer layer 110, and the first and second spacer layers 110 and 112 are subject to an anisotropic etching process. Accordingly, the gate spacer 114 is formed on the sidewalls of the gate structure 108.

Although the gate spacer 114 has been described in that the gate spacer 114 includes the first and second spacer layers 110 and 112, the example embodiments are not limited thereto. The gate spacer 114 may be formed by using only one insulating material layer. In addition, the gate spacer 114 may be formed in such a manner that the gate spacer 114 has at least two insulating material layers horizontally stacked on each other.

The recess portion 118 to define a space used to form a stressor is formed by etching a substrate surface provided at both sides of the gate spacer 114. The recess portion 118 may have various sidewall shapes. For example, the recess portion 118 may include a sigma recess having a pointed portion at the sidewall thereof and having a width narrowed downwardly. In addition, the recess portion 118 may include a box type recess having a predetermined slope at the sidewall thereof. The silicon germanium pattern 120a has various shapes depending on the shapes of the recess portion 118. Therefore, the stress applied to the channel region may be adjusted according to the shape of the recess portion 118.

Referring to 2B, a preliminary silicon germanium pattern 120 is formed by selectively epitaxial growth so that the preliminary silicon germanium pattern 120 is grown higher than the bottom surface of the gate structure 108 while filling the recess portion 118. The top surface of the preliminary silicon germanium pattern 120 may be formed higher than ⅓ of the whole height of the gate structure 108.

During the selective epitaxial growth process of forming the preliminary silicon germanium pattern 120, P type impurities may be implanted in-situ. In this case, an impurity region serving as a source/drain may be produced in the preliminary silicon germanium pattern 120. The impurity concentration of the impurity region may be greater than that of the source/drain extension region 116.

According to some embodiments, the P type impurities may be implanted during a subsequent process instead of during the selective epitaxial growth process.

The facet portion P having a predetermined slope is formed at a portion of the preliminary silicon germanium pattern 120 protruding higher than the bottom surface of the gate structure 108. Accordingly, the valley 122 having a pointed lower portion is produced between the facet portion P and the gate spacer 114. The lower portion of the valley 122 makes contact with the main surface of the silicon substrate 100.

When performing the selective epitaxial growth process, a process condition may be adjusted so that the germanium concentration is varied depending on the positions of the preliminary silicon germanium pattern 120. For example, the portion of the preliminary silicon germanium pattern 120 positioned higher than the main surface of the silicon substrate 100 may have germanium concentration higher than that of the portion of the preliminary silicon germanium pattern 120 positioned at the recess portion 118.

In the epitaxial growth process, silicon source gas, B2H6, GeH4, H2, and/or HCl may be used as reactive gas. The silicon source gas may include SiH4.

Figure 2C:
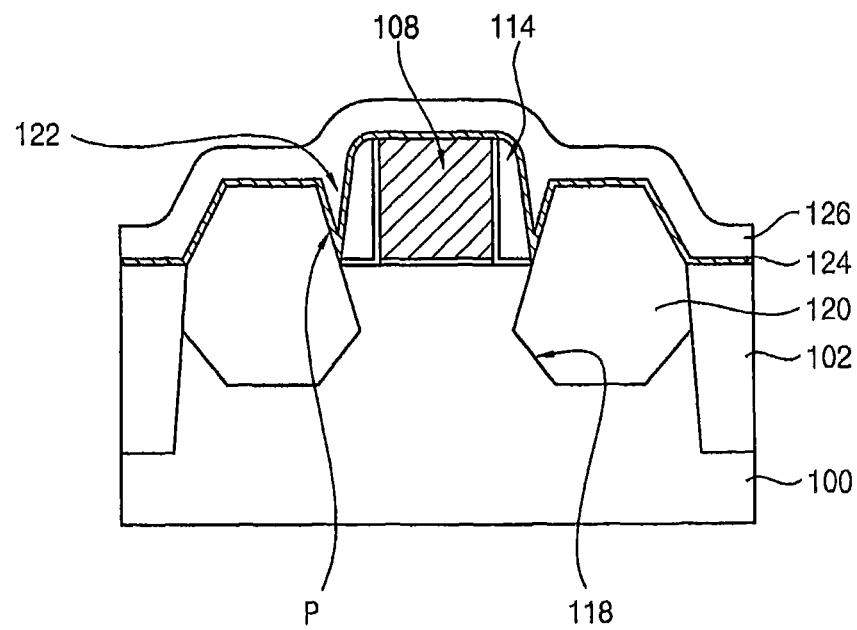

Referring to FIG. 2C, the blocking insulating layer. 124 is formed along the surfaces of the preliminary silicon germanium pattern 120, the gate spacer 114, and the gate structure 108. The blocking insulating layer 124 may extend conformally on the preliminary silicon germanium pattern 120, the gate spacer 114, and the gate structure 108.

The blocking insulating layer 124 may have a thickness not to fill the valley 112 maintain the concave shape between the silicon germanium pattern 120a and the gate spacer 114. The blocking insulating layer 124 may be thin enough not to completely fill the valley 122.

The blocking insulating layer 124 may have a thickness of 10 Å to 30 Å. The blocking insulating layer 124 having a thickness greater than 30 Å may affect the impurity doping process. As appreciated by the present inventors, if the blocking insulating layer 124 has a thickness less than 10 Å, it may not be able to serve as an sufficient etch stop layer. The blocking insulating layer 124 may include silicon nitride (Si3N4).

The insulating wing layer 126 is formed on the blocking insulating layer 124. The insulating wing layer 126 may be formed by using a material having etching selectivity with respect to the blocking insulating layer 124. The insulating wing layer 126 may include a material having an etching rate different from the blocking insulating layer 124 with respect to a predetermined etching condition. In other words, during the process of etching the insulating wing layer 126, the blocking insulating layer 124 must be hardly etched. The blocking insulating layer 124 may be formed by using silicon nitride (Si3N4) and in that case the insulating wing layer 126 may be formed by using silicon oxide (Si2O4).

The insulating wing layer 126 may have a thickness which make the insulating wing layer 126 fully fills up the valley 122 between the preliminary silicon germanium pattern 120 and the gate spacer 114. Therefore, the insulating wing layer 126 may be thicker than the blocking insulating layer 124.

Figure 2D:
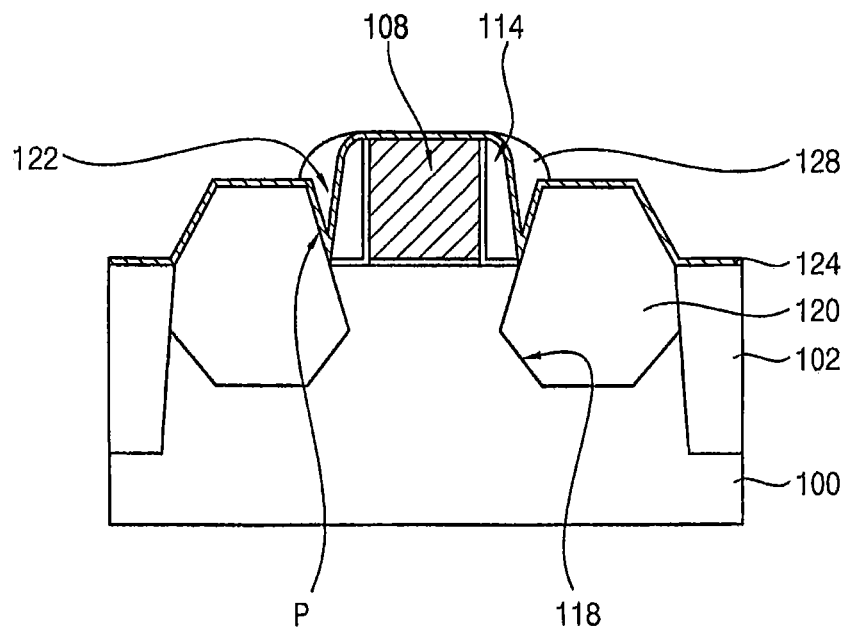

Referring to FIG. 2D, the insulating wing pattern 128 is formed by etching the insulating wing layer 126, so that the insulating wing pattern 128 fills up the valley 122 between the preliminary silicon germanium pattern 120 and the gate spacer 114. The etching process may be an anisotropic etching process.

During the etching process, the blocking insulating layer 124 may be used as an etch stop layer. The etching process may be performed to the extent that the blocking insulating layer 124 is exposed without being etched. Accordingly, the insulating wing pattern 128 may make direct contact with a portion of the blocking insulating layer 124. The portion of the blocking insulating layer 124 may provide on the gate spacer 114 and the facet portion P of the preliminary silicon germanium pattern 120 adjacent to the gate spacer 114. The insulating wing pattern 128 is not provided in remaining portions other than the valley 122 between the preliminary silicon germanium pattern 120 and the gate spacer 114. The insulating wing pattern 128 may expose a portion of the blocking insulating layer 124 formed on the upper surface of preliminary silicon germanium pattern 120.

The blocking insulating layer 124 is provided at both sides of the insulating wing pattern 128 and covers the top surface of the preliminary silicon germanium pattern 120. As described above, in the etching process of forming the insulating wing pattern 128, the preliminary silicon germanium pattern 120 is not exposed. Therefore, the height of the preliminary silicon germanium pattern 120 is maintained without the damage or the removal of the preliminary silicon germanium pattern 120 in the etching process may be reduced.

If the insulating wing pattern 128 is not provided, and if the lower portion of the valley 122 is close to the main surface of the silicon substrate 100, the lower portion of the valley 122 is disposed closely to the channel region. Therefore, when the subsequent processes are performed, an undesirable influence may be continuously exerted on the channel region through the lower portion of the valley 122.

According to some embodiments, the valley 122 is filled with the insulating wing pattern 128. Therefore, the subsequent process hardly exerts an influence on the channel region.

Figure 2E:
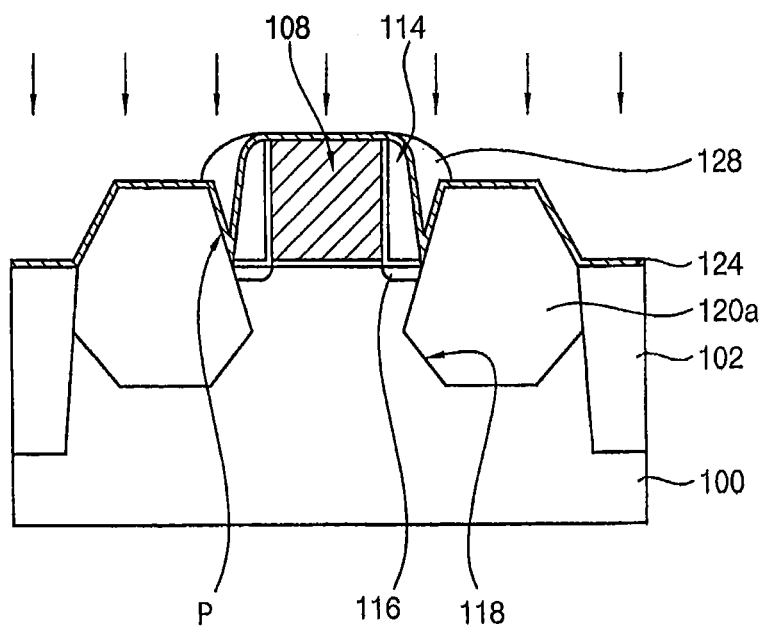

Referring to FIG. 2E, the silicon germanium pattern 120a is formed by additionally doping P type impurities into the preliminary silicon germanium pattern 120. Undesirable impurities doping into the channel region may be reduced because of the insulating wing pattern 128 in the valley 122.

Through the additional impurity doping process, impurity doping profile may be adjusted in the impurity region of the silicon germanium pattern 120a. In particular, the impurity doping profile in the portion of the silicon germanium pattern 120a adjacent to the isolation layer pattern 102 may be adjusted.

In addition, if the P type impurities are not doped in-situ in the process of forming the preliminary silicon germanium pattern 120, the impurity region may be formed by doping impurities in the present process step.

In the present process step, the impurity doping process is performed in the state that the blocking insulating layer 124 remains on the top surface of the silicon germanium pattern 120a. Accordingly, the impurity doping occurs through the blocking insulating layer 124 remains on the top surface of the silicon germanium pattern 120a. However, since the blocking insulating layer 124 has a thickness in range of 10 Å to 30 Å, the blocking insulating layer 124 hardly exerts an influence on the impurity doping process.

Figure 3:
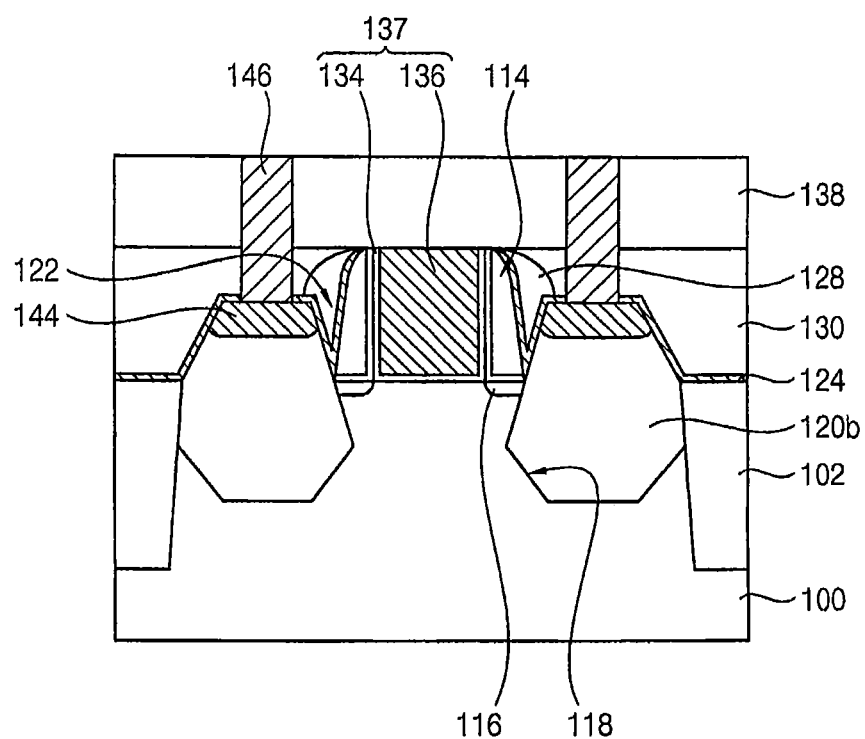
FIG. 3 is a cross-sectional view illustrating a PMOSFET according to some embodiments.

FIG. 3 is a cross-sectional view illustrating a PMOSFET according to example embodiments.

Referring to FIG. 3, the PMOSFET is formed on a silicon substrate and includes a gate structure 137, the gate spacer 114, a silicon germanium pattern 120b including an impurity region, the blocking insulating layer 124, a metallic silicide pattern 144, and the insulating wing pattern 128.

The silicon substrate 100 includes the isolation layer pattern 102 at the field region thereof. In addition, the recess portion 118 is formed at a region having stress applied thereto.

The gate structure 137 has a structure in which a gate insulating layer 134 and a gate electrode 136 are stacked. The gate insulating layer 134 may include a metallic oxide layer having a dielectric constant greater than that of silicon nitride (Si3N4). Examples of the metallic oxide materials used for the gate insulating layer 134 may include hafnium oxide (HfO2), zirconium oxide (ZrO2), etc. The metallic oxide materials may be used alone or in a combination thereof. The gate electrode 136 may include a metallic material. Examples of the metallic materials used for the gate electrode 136 may include iridium (Ir), niobium (Nb), platinum (Pt), rhenium (Re), rhodium (Rh), ruthenium (Ru), tantalum (Ta), tantalum nitride (TaN), tantalum silicon nitride (TaSiN), titanium (Ti), titanium oxide (TiN), tungsten (W), vanadium (V), etc. The metallic materials can be used alone or in a combination thereof.

The gate insulating layer 134 may have a cylindrical shape or a U shape. In other words, the gate insulating layer 134 may include a portion making contact with the surface of the silicon substrate 100 and a portion protruding perpendicularly to the surface of the silicon substrate 100.

The gate electrode 136 fills up the internal space created by the gate insulating layer 134. The gate electrode 136 may include one metallic material, or may have a structure in which at least two metallic materials are stacked. A portion of the gate electrode 136 making direct contact with the gate insulating layer 134 may include a metallic material having a work function suitable for the gate electrode of a PMOSFET, for example, it may include a metallic material having a work function of 4.5 eV to 4.9 eV.

The gate spacer 114 is provided on the sidewall of the gate structure 137. The gate structure 137 is spaced apart from the silicon germanium pattern 120b by providing the gate spacer 114.

The silicon germanium pattern 120b fills up the recess portion 118 of the silicon substrate 100 while protruding beyond the bottom surface of the gate structure 137. Silicon germanium patterns 120b are provided at both sides of gate spacers 114 on the silicon substrate 100.

A portion of the silicon germanium pattern 120b protruding beyond the bottom surface of the gate structure 137 includes a facet having a predetermined angle with respect to the flat top surface of the silicon substrate 100. The valley 122 is formed between the silicon germanium pattern 120b and the facet.

Since P type impurities are doped in the silicon germanium pattern 120b, a P type impurity region is provided in the silicon germanium pattern 120b. In other words, the P type impurity region provided in the silicon germanium pattern 120b may serve as a source/drain.

Source/drain extension regions 116 may be provided at one sides of the silicon germanium pattern 120b and at both end portions of the gate structure 137.

The germanium concentration of the silicon germanium pattern 120b may be varied depending on the positions of the silicon germanium pattern 120b. According to some embodiments, a metallic silicide pattern 144 may be provided on the silicon germanium pattern 120b. However, if the inner portion of the silicon germanium pattern 120b has high germanium concentration, crystal defects may be increased, so that a metallic silicide pattern may not be formed. Therefore, the germanium concentration may be relatively low at the upper portion of the silicon germanium pattern 120b.

In other words, a portion of the silicon germanium pattern 120b positioned at the recess portion 118 may have a germanium concentration greater than that of a portion of the silicon germanium pattern 120b protruding higher than the main surface of the silicon substrate 100. For example, the portion of the silicon germanium pattern 120b protruding higher than the main surface of the silicon substrate 100 may have a germanium concentration of 1% to 20%.

The blocking insulating layer 124 is provided along the surfaces of at least a portion of the silicon germanium pattern 120b and the gate spacer 114. According to some embodiments, the blocking insulating layer 124 may be discontinuously provided. In other words, the blocking insulating layer 124 may be provided on the surface of the gate spacer 114 and the facet of the silicon germanium pattern 120b adjacent to the gate spacer 114.

The blocking insulating layer 124 may have a thickness of 10 Å to 30 Å. The blocking insulating layer 124 may include silicon nitride (Si3N4).

The insulating wing pattern 128 is provided on a portion of the top surface of the blocking insulating layer 124. The portion of the blocking insulating layer 124 may provide on the gate spacer 114 and the facet portion P of the silicon germanium pattern 120b adjacent to the gate spacer 114. The insulating wing pattern 128 fills up the concave portion between the silicon germanium pattern 120b and the gate spacer 114. The insulating wing pattern 128 may have etching selectivity with respect to the blocking insulating layer 124. The insulating wing pattern 128 includes a material having an etching rate different from the blocking insulating layer 124 with respect to a predetermined etching condition. Where the blocking insulating layer 124 includes silicon nitride, the insulating wing pattern 128 may include silicon oxide (Si2O4).

The metallic silicide pattern 144 may be provided on the top surface of the silicon germanium pattern 120b and contact the silicon germanium pattern 120b. The metallic silicide pattern 144 may include, for example, nickel silicide (NiSi2), cobalt silicide (CoSi2), or tungsten silicide (WSi2).

The bottom surface of the metallic silicide pattern 144 may be positioned higher than the bottom surface of the gate structure 137. Where the bottom surface of the metallic silicide pattern 144 is positioned lower than the bottom surface of the gate structure 137, the impurity region may not be positioned higher than the main surface of the silicon substrate 100 undesirably.

First and second insulating interlayers 130 and 138 may be provided to cover the gate structure 137. In addition, a contact plug 146 making contact with the metallic silicide pattern 144 may be provided.

The PMOSFET according to some embodiments can represent an improved characteristic because the metallic silicide pattern 144 is positioned sufficiently higher than the main surface of the silicon substrate 100.

FIGS. 4A to 4E are cross-sectional views illustrating a method of fabricating the PMOSFET of FIG. 3.

Figure 4A:
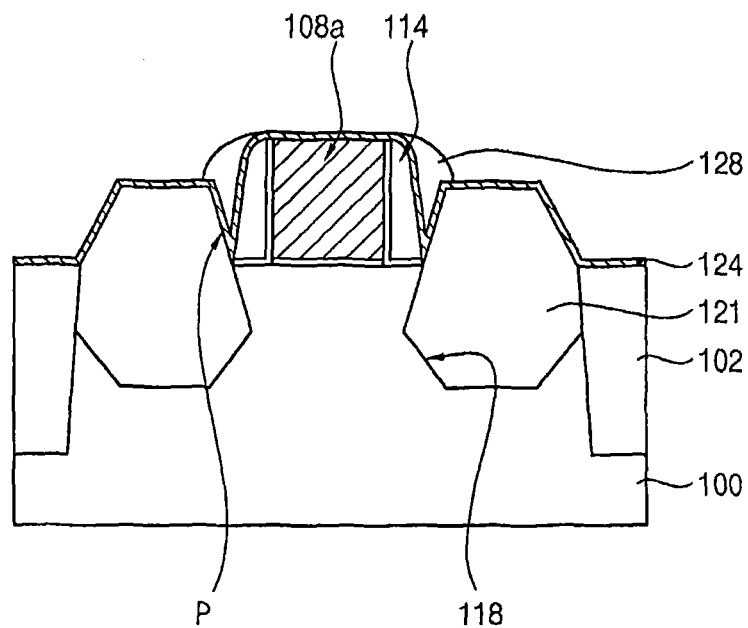
FIGS. 4A to 4E are cross-sectional views illustrating a method of fabricating the PMOSFET of FIG. 3.

Referring to FIG. 4A, a device isolation process is performed with respect to the upper portion of the silicon substrate 100, so that the isolation layer pattern 102 is formed on the silicon substrate 100 corresponding to the field region. A sacrificial gate insulating layer and a sacrificial gate electrode layer are sequentially formed on the silicon substrate 100 and patterned, thereby forming a sacrificial gate structure 108a having a sacrificial gate insulating layer pattern and a sacrificial gate electrode stacked therein. The sacrificial gate structure 108a may include a material which can be easily removed through an etching process. The process of forming the sacrificial gate structure 108a may be similar to the processes of forming the gate structure of FIG. 2A.

The processes similar to those described with reference to FIGS. 2A to 2E may be performed. The gate spacer 114, a preliminary silicon germanium pattern 121 including the impurity region, the blocking insulating layer 124, and the insulating wing pattern 128 are formed on the silicon substrate 100 including the sacrificial gate structure 108a formed thereon.

Figure 4B:
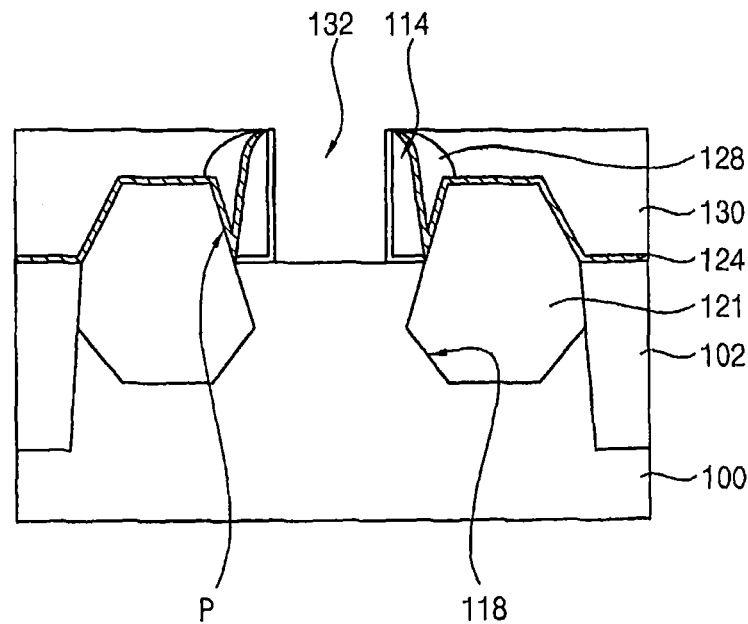

Referring to FIG. 4B, the first insulating interlayer 130 may be formed to cover the sacrificial gate structure 108a and then the top surface of the sacrificial gate electrode may be exposed by removing the first insulating interlayer 130 through a planarization process.

The sacrificial gate electrode and the sacrificial gate insulating layer are removed, thereby forming an opening 132.

Figure 4C:
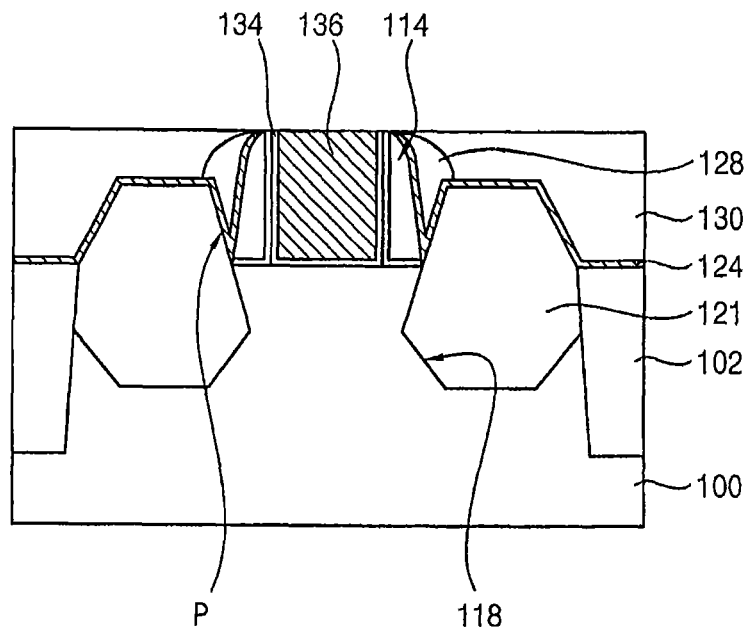

Referring to FIG. 4C, the gate insulating layer 134 is formed along the sidewalls and the bottom surface of the opening 132 and the top surface of the first insulating interlayer 130. The gate insulating layer 134 may be formed by depositing metallic oxide having a high dielectric constant. A metallic layer is formed on the gate insulating layer 134, so that the metallic layer fills up the opening 132. The metallic layer may include one metallic material, or may have a structure in which at least two metallic materials are stacked. A portion of the metallic layer making direct contact with the gate insulating layer 134 may include a metallic material having a work function of 4.5 eV to 4.9 eV.

Thereafter, the metallic layer and the gate insulating layer 134 formed on the first insulating interlayer 130 are removed. The gate insulating layer 134 and the gate electrode 136 are formed in the opening 132 through the above processes. Through the processes, the gate structure 137 having metallic oxide and metal stacked therein can be completed.

Figure 4D:
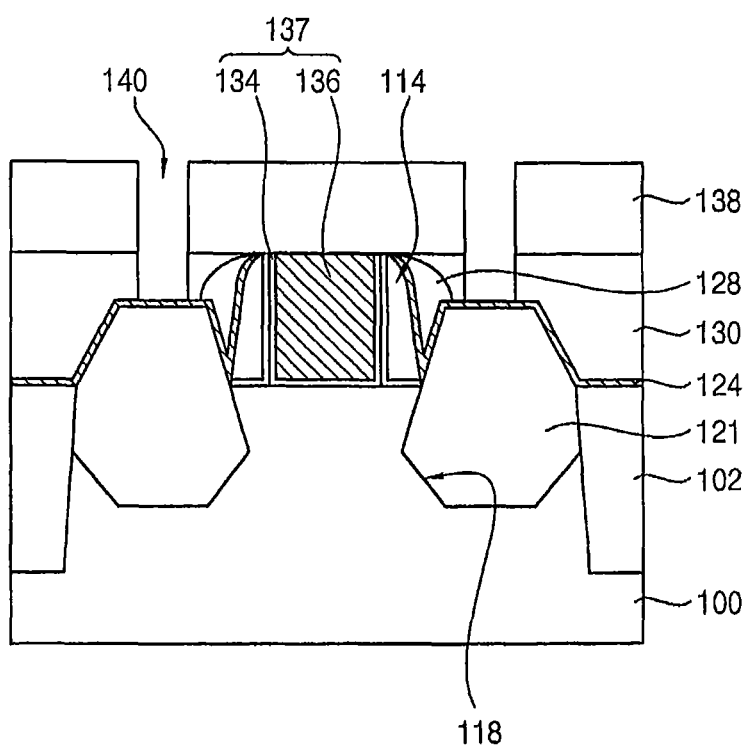

Referring to FIG. 4D, the second insulating interlayer 138 may be formed on the first insulating interlayer 130 and preliminary contact hole 140 may be formed by etching a portion of the second insulating interlayer 138 so that the preliminary contact hole 140 exposes the blocking insulating layer provided on the top surface of the preliminary silicon germanium pattern 121. In the etching process of forming the preliminary contact hole 140, the blocking insulating layer 124 may be used as an etch stop layer. During the process of forming the preliminary contact hole 140, the preliminary silicon germanium pattern 121 is not exposed.

Figure 4E:
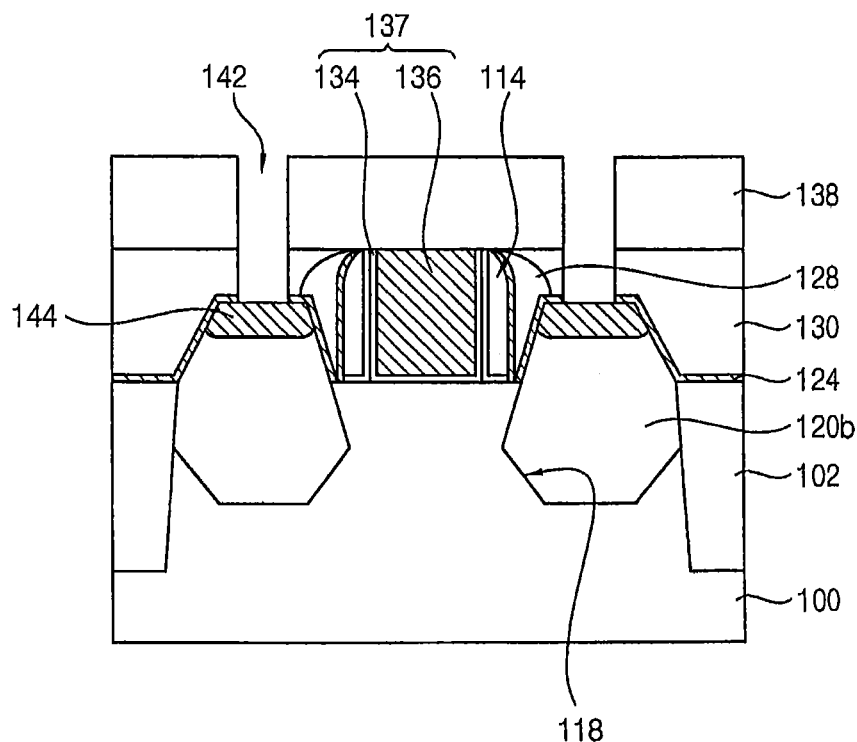

Referring to FIG. 4E, a contact hole 142 may be formed to expose the top surface of the preliminary germanium pattern 121 by etching the blocking insulating layer 124 exposed to the bottom surface of the preliminary contact hole 140. The lower portion of the contact hole 142 may be surrounded by the blocking insulating layer 124.

Since the contact hole 142 is formed by using the blocking insulating layer 124 as an etch stop layer, etching or damage on the preliminary silicon germanium pattern 121 in the lower portion of the contact hole 142 can be reduced.

The metallic silicide pattern 144 may be formed on the preliminary silicon germanium pattern 121 in the lower portion of the contact hole 142. In order to form the preliminary silicon germanium pattern 121, a process of forming a metallic layer and a process of allowing the metallic layer to react with the preliminary silicon germanium pattern 121 may be performed. The bottom surface of the metallic silicide pattern 144 higher than the bottom surface of the gate structure 137 is desirable. In the process of forming the metallic silicide pattern 144, the preliminary silicon germanium pattern 121 is removed through the reaction, thereby forming the silicon germanium pattern 120b.

Thereafter, as illustrated in FIG. 3, the contact plug 146 is formed by filling a conductive material in the contact hole 142.

Since the metallic silicide pattern 144 is formed through the reaction with the preliminary silicon germanium pattern 120, if the preliminary silicon germanium pattern 121 does not have a sufficient height, the bottom surface of the metallic silicide pattern 144 may be positioned lower than the bottom surface of the gate structure 137. In addition, if the top surface of the preliminary silicon germanium pattern 121 is over-etched in the process of forming the contact hole 142 and the previous etching processes, the bottom surface of the metallic silicide pattern 144 may be positioned lower than the bottom surface of the gate structure 137.

However, according to some embodiments, since the etching process may be performed by using the blocking insulating layer 124 as an etch stop layer, the top surface of the preliminary silicon germanium pattern 121 is hardly etched in the process of forming the contact hole 142 and the process of forming the insulating wing pattern 128. Accordingly, the bottom surface of the metallic silicide pattern 144 may be positioned sufficiently higher than the bottom surface of the gate structure 137. Therefore, the PMOSFET formed through the method can represent a superior characteristic.

Figure 5:
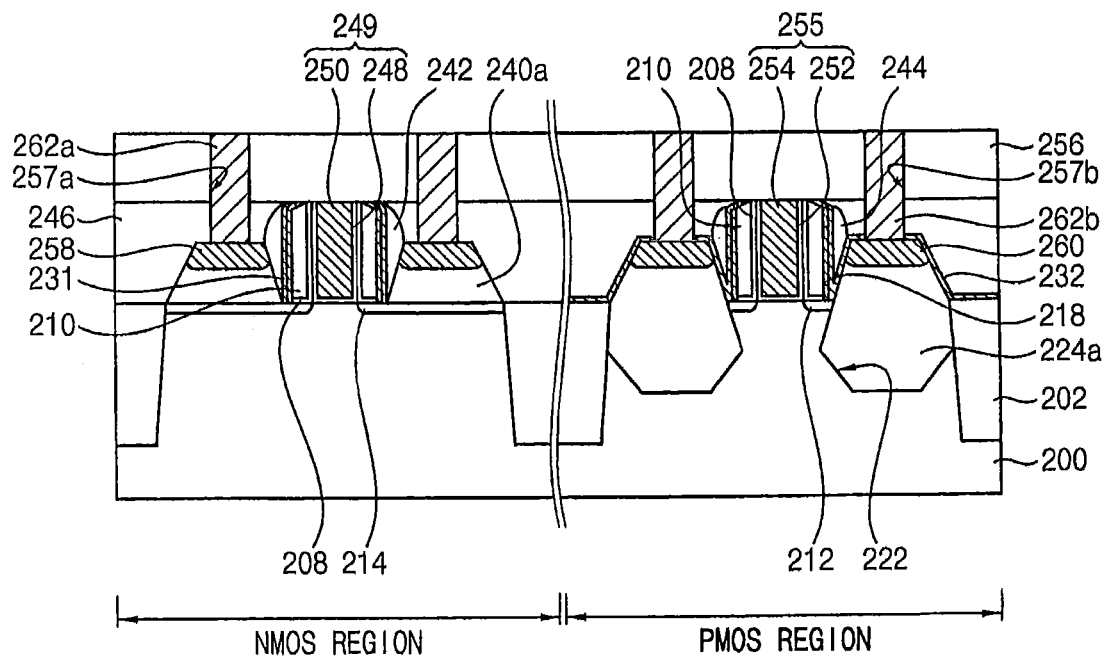
FIG. 5 is a cross-sectional view illustrating a CMOSFET according to some embodiments.

FIG. 5 is a cross-sectional view illustrating a CMOSFET according to some embodiments. Referring to FIG. 5, a silicon substrate 200 including NMOS and PMOS regions is prepared. The NMOS region includes an NMOSFET and the PMOS region includes a PMOSFET.

The NMOSFET includes a first gate structure 249, spacers 208, 210, 231, a silicon pattern 240a, a first metallic silicide pattern 258, and a first insulating wing pattern 242. The PMOSFET includes a second gate structure 255, spacers 208, 210, 231, a silicon germanium pattern 224a, a blocking insulating layer pattern 232, a second metallic silicide pattern 260, and a second insulating wing pattern 244.

An isolation layer pattern 202 is provided in a field region of the silicon substrate 200. Semiconductor patterns elevated from the main surface of the silicon substrate 200 are provided in the NMOS and PMOS regions of the silicon substrate 200, respectively. In addition, a recess portion 222 is formed in a portion of the PMOS region of the silicon substrate 200 having the semiconductor pattern.

The first gate structure 249 has a first gate insulating layer 248 and a first gate electrode 250 stacked therein. The first gate insulating layer 248 may include a metallic oxide layer having a high dielectric constant. The first gate electrode 250 may include a metallic material.

The first gate insulating layer 248 may have a cylindrical shape or a U shape. In other words, the first gate insulating layer 248 may include a portion making contact with the surface of the silicon substrate 200 and a portion protruding upward from the silicon substrate 200.

The first gate electrode 250 fills up the internal space defined by the first gate insulating layer 248. The first gate electrode 250 may include one metallic material, or may have a structure in which at least two metallic materials are stacked. A portion of the first gate electrode 250 making direct contact with the first gate insulating layer 248 may include a metallic material having a work function suitable for the NMOSFET, for example, a metallic material having a work function of 4.1 eV to 4.4 eV.

The first gate structure 249 is provided on sidewalls thereof with first to third gate spacers 208, 210, and 231. Hereinafter, the first to third gate spacers 208, 210, and 231 of the first gate structure 249 are described first group spacers 208, 210, and 231 hereinbelow. The first group spacers 208, 210, and 213 are interposed between the first gate structure 249 and the silicon pattern 240a so that the first gate structure 249 is spaced apart from the silicon pattern 240a.

The silicon pattern 240a protrudes from the main surface of the silicon substrate 200. The silicon pattern 240a includes a facet which is formed on a surface of the silicon pattern 240a facing the lower portion of the first gate structure 249 and has a predetermined angle with respect to the main surface of the silicon substrate 200. A valley is formed between the facet of the silicon pattern 240a and the gate spacer.

N type impurities are doped into the silicon pattern 240a, thereby forming an N type impurity region. In other words, the N type impurity region provided in the silicon pattern 240a serves as a source/drain. As described above, the silicon pattern 240a is positioned higher than the main surface of the silicon substrate 200, so that the silicon pattern 240a serves as an elevated source/drain. Accordingly, the channel length of the NMOS FET may be increased.

First source/drain extension regions 214 may be provided at one sides of the silicon pattern 240a and at both end portions of the first gate structure 249.

The first insulating wing pattern 242 fills up the concave portion between the silicon pattern 240a and the gate spacers.

The NMOSFET may not include a blocking insulating layer pattern. Therefore, the first insulating wing pattern 242 may make direct contact with a portion of the silicon pattern 240a and the surface of the spacer 231. In addition, the first insulating wing pattern 242 may not be provided in remaining regions outside of the valley between the silicon pattern 240a and the spacer 231.

The silicon pattern 240a has less defects and strong bonding compared with the silicon germanium pattern 224a. Therefore, the silicon pattern 240a has stronger resistance against the etching process compared with the silicon germanium pattern 224a, so that the silicon pattern 240a may be less damaged or removed during the etching process. Therefore, even if the blocking insulating layer is not provided in the NMOSFET, damage or removal of the silicon pattern 240a may not be a problem.

The first metallic silicide pattern 258 may be provided on the top surface of the silicon pattern 240a. The first metallic silicide pattern 258 may include nickel silicide (NiSi2), cobalt silicide (CoSi2), or tungsten silicide (WSi2).

The bottom surface of the first metallic silicide pattern 258 may be disposed higher than the bottom surface of the first gate structure 249. If the bottom surface of the first metallic silicide pattern 258 is be positioned lower than the bottom surface of the first gate structure 249, the impurity region may not be positioned higher than the main surface of the silicon substrate 200 undesirably.

First and second insulating interlayers 246 and 256 may be provided to cover first gate structures 249. A first contact plug 262a may be provided through the first and second insulating interlayers 246 and 256 to make contact with the first metallic silicide pattern 258.

The second gate structure 255 has a second gate insulating layer 252 and a second gate electrode 254 stacked therein. The second gate insulating layer 252 may include a metallic oxide layer having a high dielectric constant. The second gate electrode 254 may include a metallic material. The second gate electrode 254 may include a metallic material different from that of the first gate electrode 250.

The second gate electrode 254 may include one metallic material or may have a structure in which at least two metallic materials are stacked. A portion of the second gate electrode 254 making direct contact with the second gate insulating layer 252 may include a metallic material having a work function suitable for the PMOSFET.

The second gate structure 255 is provided on sidewalls thereof with first to third gate spacers 208, 210, and 218. The gate spacers 208, 210, and 218 of the second gate structure 255 are described as second group spacers 208, 210, and 218 hereinbelow.

The blocking insulating layer pattern 232 may not be provided on the surface of the first gate structure 249. A portion of the blocking insulating layer used to form the blocking insulating layer pattern may remain to serve as the outermost first group spacer. Accordingly, the width of the first group spacers 208, 210, and 231 may be wider than the width of the second group spacers 208, 210, and 218.

The silicon germanium pattern 224a fills up the recess portion 222 of the silicon substrate 200 while protruding beyond the bottom surface of the second gate structure 255. The portion of the silicon germanium pattern 224a protruding beyond the bottom surface of the second gate structure 255 includes a facet having a predetermined angle with respect to the flat top surface of the silicon substrate 200. A valley is formed between the facet of the silicon germanium pattern 224a and the third gate spacer 218. The silicon germanium pattern 224a may include an impurity region serving as a P type source/drain.

Second source/drain extension regions 212 including P type impurities may be provided at one sides of the silicon germanium pattern 224a and at both end portions of the second gate structure 255.

The blocking insulating layer pattern 232 is provided along the surfaces of at least a portion of the silicon germanium pattern 224a and the second group spacers 208, 210, and 218. The blocking insulating layer pattern 232 may extend conformally on the silicon germanium pattern 224a and the second group spacers 208, 210, and 218.

The second insulating wing pattern 244 is provided on a portion of the top surface of the blocking insulating layer pattern 232. The second insulating wing pattern 244 may make direct contact with the top surface of the blocking insulating layer pattern 232 provided on the second group spacers 208, 210, and 218 and the facet of the silicon germanium pattern adjacent to the second group spacers 208, 210, and 218. The second insulating wing pattern 244 and the first insulating wing pattern 242 may include an identical insulating material. The first and second insulating wing patterns 242 and 244 may include an insulating material having etching selectivity with respect to the blocking insulating layer pattern 232. The first and second insulating wing patterns 242 and 244 may include a material having an etching rate different from the blocking insulating layer 232 with respect to a predetermined etching condition. For example, the blocking insulating layer pattern 232 may include silicon nitride (Si3N4), and the first and second insulating wing patterns 242 and 244 may include silicon oxide (Si2O4).

The second insulating wing pattern 244 fills up the concave portion between the silicon germanium pattern 224a and the third spacer 218.

The second metallic silicide pattern 260 may be provided on the top surface of the silicon germanium pattern 224a and may contact the silicon germanium pattern 224a. According to some embodiments, the first and second metallic silicide patterns 258 and 260 may include an identical material. The first and second metallic silicide patterns 258 and 260 may include different materials according to some embodiments.

The bottom surface of the second metallic silicide pattern 260 may be disposed higher than the bottom surface of the second gate structure 255.

The first and second insulating interlayers 246 and 256 may be provided to cover the second gate structure 255. In addition, a second contact plug 262b may be provided through the first and second insulating interlayers 246 and 256 to make contact with the second metallic silicide pattern 260. The lower portion of the second contact plug 262b may be surrounded by the blocking insulating layer 232.

According to some embodiments, damage on or etch of the silicon pattern in the NMOSFET and the silicon germanium pattern in the PMOSFET may be reduced. The impurity region and the metallic silicide pattern of the MOSFET, which are positioned sufficiently higher than the main surface of the silicon substrate may improve the CMOSFET performance.

FIGS. 6A to 6J are cross-sectional views illustrating a method of fabricating the CMOSFET of FIG. 5.

Figure 6A:
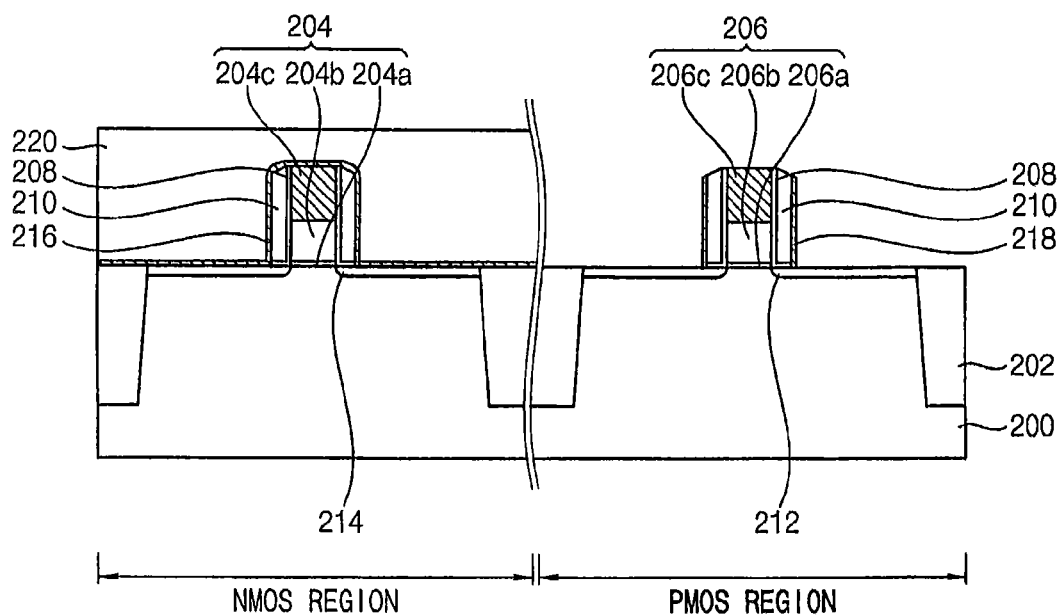

Referring to FIG. 6A, a device isolation process is performed with respect to silicon substrate 200, so that the isolation layer pattern 202 is formed on the silicon substrate 200 corresponding to the field region.

The sacrificial gate insulating layer and the sacrificial gate electrode layer are formed on the silicon substrate 200. Hard mask patterns 204c, 206c may be formed on the sacrificial gate electrode layer. The sacrificial gate insulating layer and the sacrificial gate electrode layer are patterned by using the hard mask patterns 204c, 206c. Accordingly, the sacrificial gate structures 204 and 206 include the sacrificial gate insulating layers 204a and 206a and the sacrificial gate electrodes 204b and 206b stacked therein. The first sacrificial gate structure 204 is formed in the NMOS region of the silicon substrate 200, and the second sacrificial gate structure 206 is formed in the PMOS region of the silicon substrate 200.

A first spacer layer is formed along the surfaces of the first and second sacrificial gate structures 204 and 206 and the surface of the silicon substrate 200. The first source/drain extension regions 214 are formed by doping N type impurities under the surface of the silicon substrate 200 provided both sides of the first sacrificial gate structure 204. In addition, the second source/drain extension regions 212 are formed by doping P type impurities under the surface of the silicon substrate 200 provided both sides of the second sacrificial gate structure 206.

A second spacer layer may be formed on the first spacer layer, and the first and second spacer layers are anisotropic-etched. Accordingly, the first and second gate spacers 208 and 210 are formed on the sidewalls of the first and second gate structures 204 and 206, respectively.

The first blocking insulating layer is formed along the first and second sacrificial gate structures 204 and 206, the first and second spacers 208 and 210, and the silicon substrate 200. A first photoresist pattern 220 to cover the NMOS region may be formed by performing a photo process. Thereafter, the first blocking insulating layer pattern 216 is formed by removing the first blocking insulating layer of the PMOS region through the etching process.

The first blocking insulating layer pattern 216 is formed in the NMOS region. The first blocking insulating layer pattern 216 serves as a mask to grow selectively an epitaxial layer only on the PMOS region.

When the etching process is an isotropic etching process, the entire portion of the first blocking insulating layer of the PMOS region may be removed. However, when the etching process is an anisotropic process, only the first blocking insulating layer remains on the sidewall of the second gate structure 206 to serve as the third spacer 218.

Figure 6B:
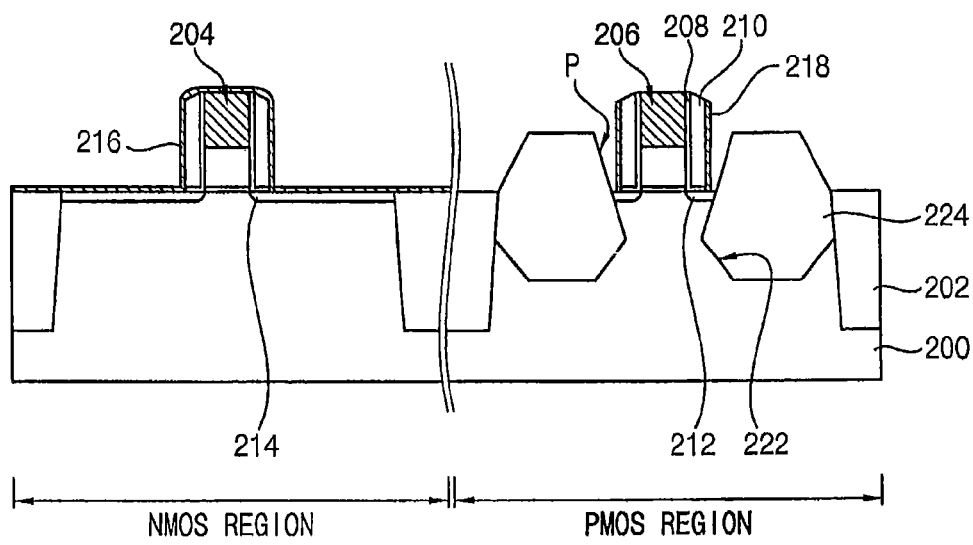

Referring to FIG. 6B, the recess portion 222 defining a space used to form a stressor is formed by etching the surface of the silicon substrate 200 provided at both sides of the gate spacers 208, 210, and 218 of the PMOS region.

The preliminary silicon germanium pattern 224 fills up the recess portion 222 while protruding higher than the bottom surface of the second sacrificial gate structure 206.

The preliminary silicon germanium pattern 224 may be formed through the selective epitaxial growth process. In the epitaxial growth process, the impurity region may be formed by implanting P type impurities in-situ.

An epitaxial layer may be grown only from the exposed region of the silicon substrate 200. Accordingly, the preliminary silicon germanium pattern 224 is not formed in the NMOS region in which the first blocking insulating layer pattern 216 is covered.

Figure 6C:
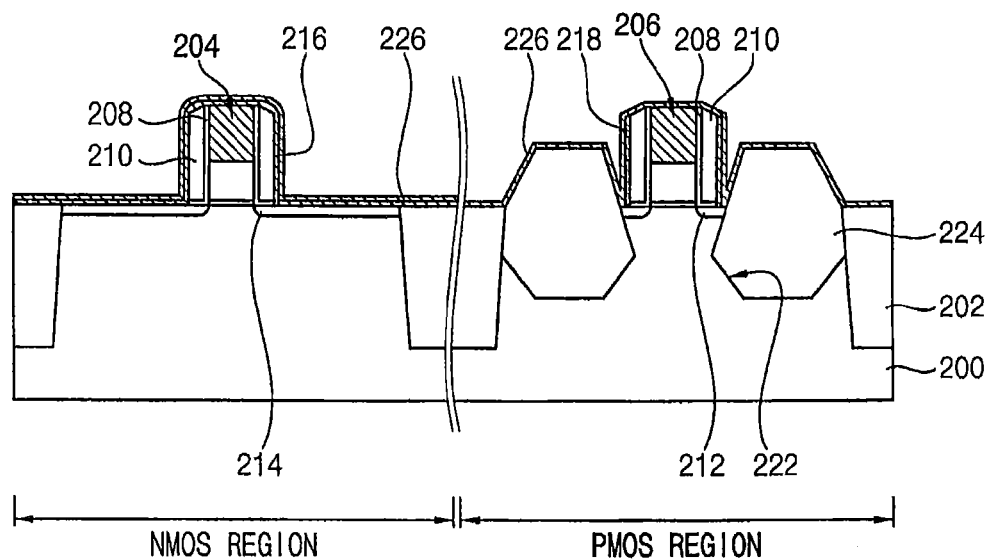

Referring to FIG. 6C, the second blocking insulating layer 226 is formed along the surfaces of the first blocking insulating layer pattern 216, the preliminary silicon germanium pattern 224, and the second sacrificial gate structure 206. The second blocking insulating layer 226 may have a thickness in range of 10 Å to 30 Å.

The second blocking insulating layer 226 and the first blocking insulating layer pattern 216 may include an identical material. For example, the second blocking insulating layer 226 may include silicon nitride (Si3N4). As described above, the first blocking insulating layer pattern 216 and the second blocking insulating layer 226 are stacked in the NMOS region.

Figure 6D:
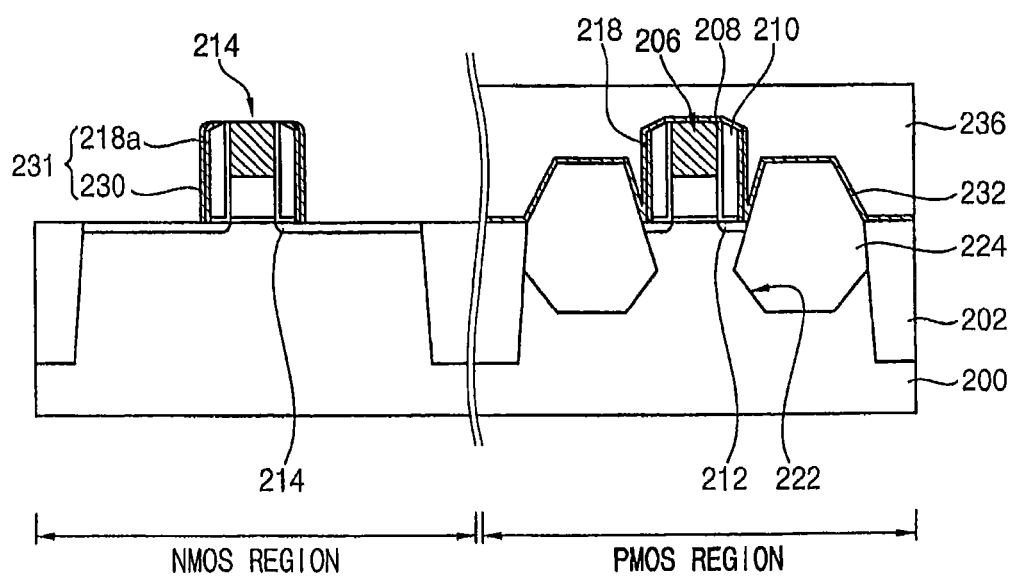

Referring to FIG. 6D, the second photoresist pattern 236 may be formed to cover PMOS region on the second blocking insulating layer 226 by performing the photo process. The second blocking insulating layer 226 and the first blocking insulating layer pattern 216 of the NMOS region are etched through an anisotropic etching process. After the above etching process has been performed, the third spacer 231 including the second blocking insulating layer 226 and the first blocking insulating layer pattern 216 may be formed on the sidewall of the first sacrificial gate structure 204. As described above, the third spacer 231 formed on the sidewall of the first sacrificial gate structure 204 may be thicker than the third spacer 218 formed on the sidewall of the second sacrificial gate structure 206.

The second blocking insulating layer pattern 232 may be formed in the PMOS region. The second blocking insulating layer pattern 232 serves as a mask so that an epitaxial layer is selectively grown only in the NMOS region.

Figure 6E:
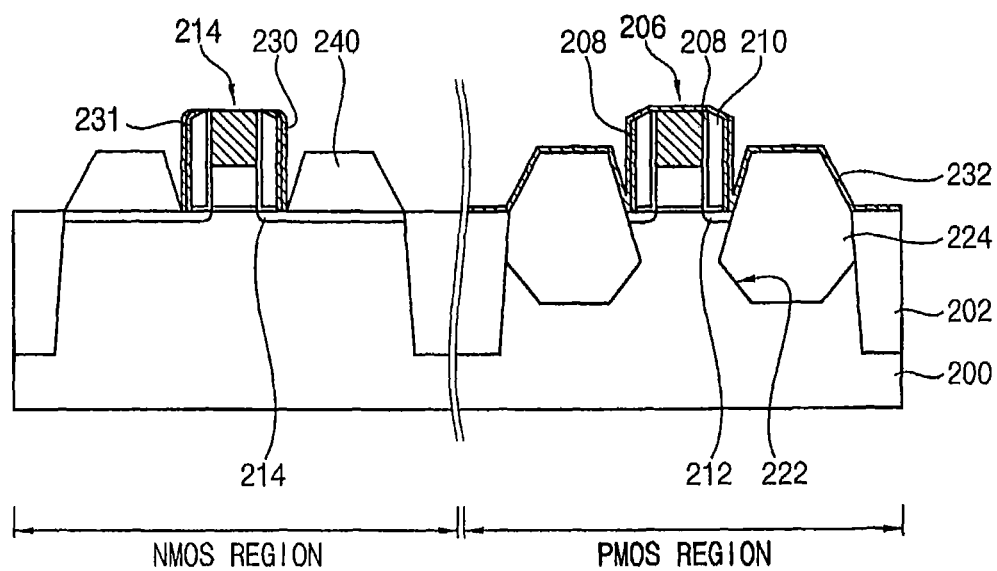

Referring to FIG. 6E, the preliminary silicon pattern 240 is formed on the substrate surface provided at both sides of the gate spacer provided in the NMOS region.

The preliminary silicon pattern 240 may be formed through the selective epitaxial growth process. The impurity region may be formed by implanting N type impurities in-situ in the epitaxial growth process.

The epitaxial layer is grown only in the exposed portion of the silicon substrate 200. Therefore, the silicon pattern is not formed in the PMOS region in which the second blocking insulating layer pattern 232 is covered.

According to some embodiments, before the preliminary silicon pattern 240 is formed, the recess portion may be formed by etching the substrate provided at both sides of the gate spacer of the NMOS region. In this case, the preliminary silicon pattern 240 may fill up the recess portion while protruding upward from the main surface of the silicon substrate.

Figure 6F:
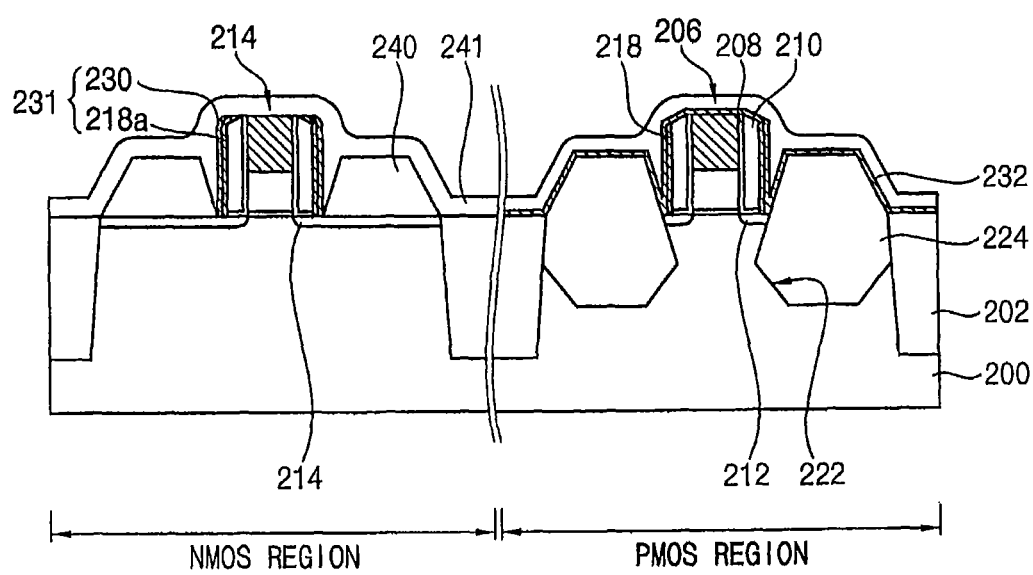

Referring to FIG. 6F, the insulating wing layer 241 is formed along the surfaces of the preliminary silicon pattern 240, the third spacer 231, the first sacrificial gate structure 204, and the second blocking insulating layer pattern 232. The insulating wing layer 241 includes a material having etching selectivity with respect to the second blocking insulating layer pattern 232. The insulating wing layer 241 may include a material having an etching rate different from the blocking insulating layer pattern 232 with respect to a predetermined etching condition. In other words, the second blocking insulating layer pattern 232 may not be etched in the process of etching the insulating wing layer 241. The second blocking insulating layer pattern 232 may include silicon nitride (Si3N4) and the insulating wing layer 241 may include silicon oxide (Si2O4).

The insulating wing layer 241 has a thickness fills up the valley, which is interposed between the preliminary silicon germanium pattern 224 and the third spacer 218, and the valley which is interposed between the preliminary silicon pattern 240 and the third spacer 231. Therefore, the insulating wing layer 241 is thicker than the second blocking insulation pattern 232.

As illustrated in drawings, the second blocking insulation pattern 232 may be provided only in the PMOS region, and not formed in the NMOS region.

Figure 6G:
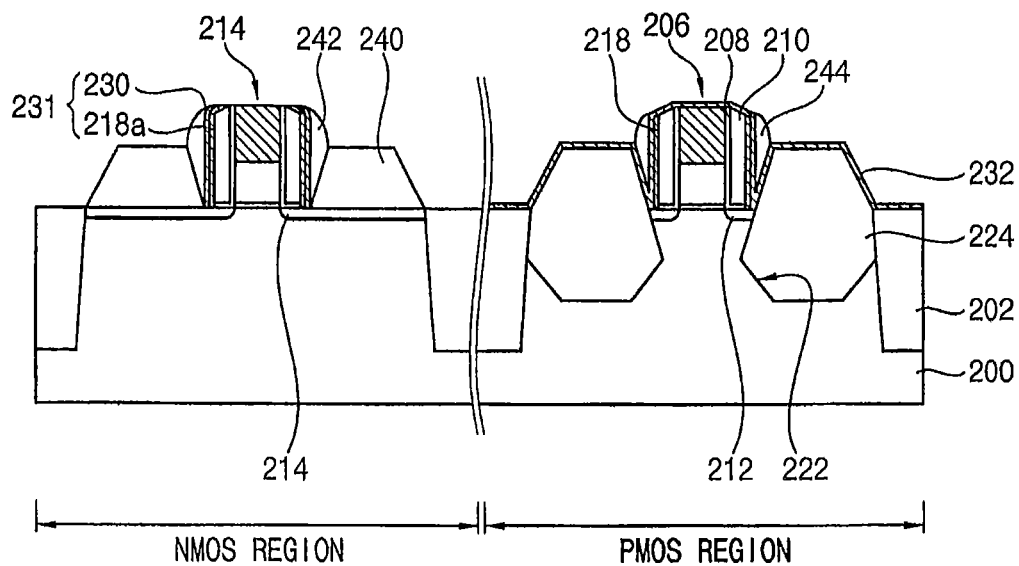

Referring to FIG. 6G, the first insulating wing pattern 242 is formed by etching the insulating wing layer 241 so that the first insulating wing pattern 242 fills up the valley between the preliminary silicon pattern 240 and the third spacer 231. The second insulating wing pattern 244 fills up the valley between the preliminary silicon germanium pattern 224 and the third spacer 218. The etching process may be an anisotropic etching process. Since the first and second insulating wing patterns 242 and 244 are formed by etching the insulating wing layers, respectively, the first and second insulating wing patterns 242 and 244 may include the same insulating material.

During the etching process, the second blocking insulating layer pattern 232 is used as an etch stop layer. In other words, the etching process is performed until the second blocking insulating layer pattern 232 is exposed. Accordingly, the second insulating wing pattern 244 makes direct contact with the second blocking insulating layer pattern 232.

In addition, the second blocking insulation pattern 232 may be exposed at both sides of the second insulating wing pattern 244. In other words, in the process of etching the second insulating wing pattern 244, the preliminary silicon germanium pattern 224 is not exposed. Therefore, damage or etching of the preliminary silicon germanium pattern 224 during the etching process may be reduced.

The second blocking insulating layer pattern 232 may not be provided in the NMOS region. If the anisotropic etching process is performed to form the first insulating wing pattern 242, the top surface of the preliminary silicon pattern 240 is exposed. However, since the preliminary silicon pattern 240 has stronger etching resistance compared with the preliminary silicon germanium pattern 224, the preliminary silicon pattern 240 may not be damaged through the anisotropic etching process of forming the first insulating wing pattern 242 even if the second blocking insulating layer pattern 232 is not provided.

Figure 6H:
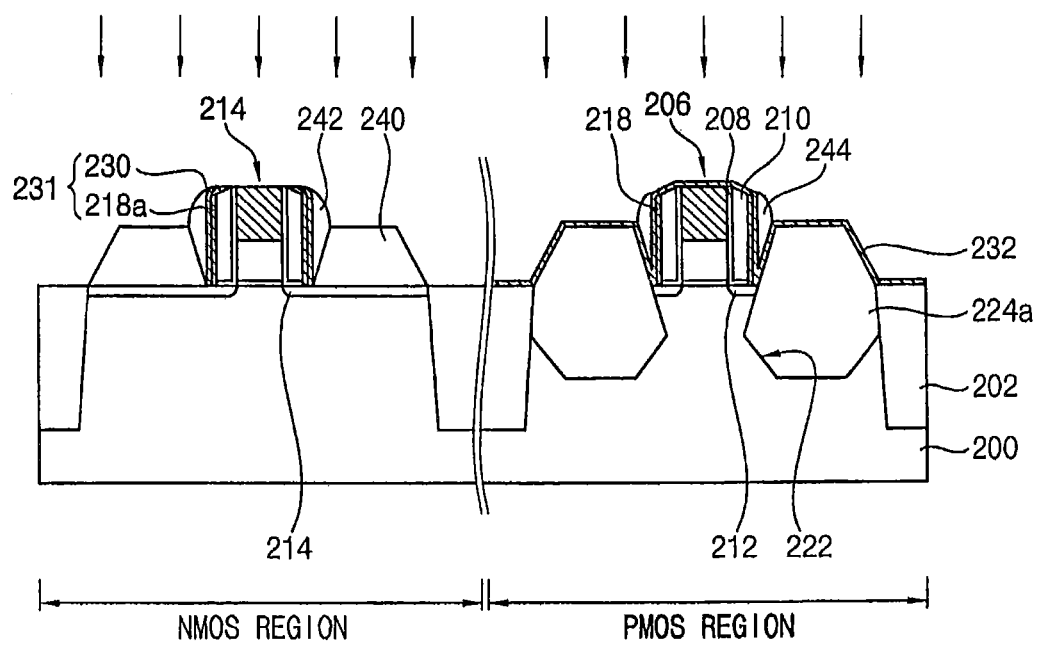

Referring to FIG. 6H, the P type impurities are additionally doped into the preliminary silicon germanium pattern 224 of the PMOS region.

The impurity doping process is performed while the second blocking insulating layer pattern 232 is provided on the top surface of the preliminary silicon germanium pattern 224. However, since the second blocking insulating layer pattern 232 has a thickness in range of 10 Å to 30 Å, the second blocking insulating layer pattern 232 may not affect the impurity doping process.

In addition, the N type impurities are additionally doped into the preliminary silicon pattern 240 of the NMOS region.

Referring to FIG. 6I, the first insulating interlayer 246 may be formed to cover the first and second sacrificial gate structures 204 and 206. Thereafter, the first insulating interlayer 246 is removed through a planarization process, thereby exposing the top surface of the first and second sacrificial gate electrodes.

The first opening may be formed by removing the first sacrificial gate electrode and the first sacrificial gate insulating layer. The first gate insulating layer 248 and the first gate electrode 250 are formed in the first opening. The first gate insulating layer 248 may include metallic oxide having a high dielectric constant and the first gate electrode 250 may include metal.

In addition, the second opening may be formed by removing the second sacrificial gate electrode and the second sacrificial gate insulating layer. The second gate insulating layer 252 and the second gate electrode 254 are formed in the second opening. The second gate insulating layer 252 may include metallic oxide having a high dielectric constant and the second gate electrode 254 may include metal. The first and second gate electrodes 250 and 254 may include different metallic materials.

The stacked structure of the first gate insulating layer 248 and the first gate electrode 250 comprises the first gate structure 249, and the stacked structure of the second gate insulating layer 252 and the second gate electrode 254 comprises the second gate structure 255.

Referring to FIG. 6J, the second insulating interlayer 256 may be formed on the first insulating interlayer 246.

A portion of the second insulating interlayer 256 provided on the preliminary silicon pattern 240 and the preliminary silicon germanium pattern 224 is etched and exposes the second blocking insulating layer pattern 232 positioned on the top surface of the preliminary silicon germanium pattern 224.

The first contact hole 257a to expose the top surface of the preliminary silicon pattern 240 and the second contact hole 257b to expose the top surface of the preliminary silicon germanium pattern 224 are formed by etching the exposed second blocking insulating layer pattern 232.

The first and second metallic silicide patterns 258 and 260 may be formed on the preliminary silicon pattern 240 and the preliminary silicon germanium pattern 224 in the first and second contact holes 257a and 257b, respectively. The bottom surfaces of the first and second metallic silicide patterns 258 and 260 disposed higher than the bottom surface of the first and second gate structures 249 and 255 are desirable. In the process of forming the first and second metallic silicide patterns 258 and 260, the upper portions of the preliminary silicon pattern 240 and the preliminary silicon germanium pattern 224 are removed through the reaction. Accordingly, the silicon pattern 240a and the silicon germanium pattern 224a are formed through the above process.

Thereafter, the first and second contact plugs 262a and 262b are formed by filling metallic materials in the first and second contact holes 257a and 257b.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device, comprising:
   a semiconductor substrate including an NMOSFET region and a PMOSFET region;
   a first gate structure and first spacers on sidewalls of the first gate structure in the NMOSFET region;
   a second gate structure and second spacers on sidewalis of the second gate structure in the PMOSFET region;
   a silicon pattern on a side of the first gate structure in the NMOSTET region, wherein the silicon pattern includes a first protruded portion having a top surface that is higher than a bottom surface of the first gate structure and a first facet, and wherein the first facet is slanted at a first predetermined angle with respect to an upper surface of the semiconductor substrate and forms a first concave portion with one of the first spacers;
   a silicon germanium pattern on a side of the second gate structure in the PMOSFET region, wherein the silicon germanium pattern includes a second protruded portion having a top surface that is higher than a bottom surface of the second gate structure, a second facet that is higher than the bottom surface of the second gate structure and a third facet that is opposite the second facet, and wherein the second facet is slanted at a second predetermined angle with respect to the upper surface of the semiconductor substrate and foi HIS a second concave portion with one of the second spacers;
   a blocking insulating layer extending along the top surface, the second facet and the third facet of the second protruded portion of the silicon germanium pattern and the second spacers, wherein a portion of the blocking insulating layer that extends along the one of the second spacers and the second facet of the second protruded portion of the silicon germanium pattern defines a recess in the second concave portion;
a first insulating wing pattern in the first concave portion;
a second insulating wing pattern in the recess; and
an insulating interlayer on the first insulating wing pattern and the second insulating wing pattern, wherein the blocking insulating layer exposes the NMOSFET region, and
wherein the insulatino interlayer directly contacts the blocking insulating layer and the silicon pattern and covers the first and second gate structures.

2. The semiconductor device of claim 1, wherein the first and second insulating wing patterns comprise an insulating material having an etching rate different from that of the blocking insulating layer under a predetermined etching condition.

3. The semiconductor device of claim 1, further comprising a first metallic silicide pattern on the silicon pattern and a second metallic suicide pattern on the silicon germanium pattern, wherein the first and second metallic silicide patterns contact the silicon pattern and the silicon geinianium pattern respectively, and
wherein the first and second metallic silicide patterns comprise bottom surfaces higher than the bottom surfaces of the first and second gate structures respectively.

4. The semiconductor device of claim 1, wherein the first gate structure includes a first gate electrode and the second gate structure includes a second gate electrode, and
wherein the first and second gate electrodes comprise a metal, and
wherein the blocking insulating layer exposes a top surface of the second gate structure.

5. The semiconductor device of claim 1, wherein the first and second insulating wing patterns comprise an identical material.

6. The semiconductor device of claim 1, wherein the first insulating wing pattern directly contacts the one of the first spacers and the first facet of the silicon pattern.

7. The semiconductor device of claim 6, wherein the second insulating wing pattern directly contacts the portion of the blocking insulating layer that extends along the one of the second spacers and the second facet of the second protruded portion of the silicon germanium pattern.

8. The semiconductor device of claim 1, wherein the blocking insulating layer has a thickness in range of 10 Å to 30 Å.

9. The semiconductor device of claim 1, wherein the blocking insulating layer directly contacts the top surface, the second facet and the third facet of the second protruded portion of the silicon germanium pattern, and
wherein the device further comprises a contact plug that extends through the insulating interlayer and the blocking insulating layer and directly contacts the silicon germanium pattern.

* * * * *